(12) United States Patent
Kepler et al.

(10) Patent No.: US 6,169,005 B1
(45) Date of Patent: Jan. 2, 2001

(54) FORMATION OF JUNCTIONS BY DIFFUSION FROM A DOPED AMORPHOUS SILICON FILM DURING SILICIDATION

(75) Inventors: Nick Kepler, Saratoga, CA (US); Karsten Wieczorek, Reichenberg-Boxdorf (DE); Larry Wang, San Jose; Paul Raymond Besser, Sunnyvale, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/318,824

(22) Filed: May 26, 1999

(51) Int. Cl.$^7$ .................................................. H01L 21/386
(52) U.S. Cl. .................... 438/301; 438/229; 438/558; 438/559; 438/581; 438/582
(58) Field of Search .................................. 438/197, 229, 438/299, 301, 558, 559, 582, 583, 580, 581

(56) References Cited

U.S. PATENT DOCUMENTS

| | | | |
|---|---|---|---|
| 4,558,507 | * 12/1985 | Okabayashi et al. | 29/571 |
| 5,576,244 | * 11/1996 | Hayashi et al. | . |
| 5,818,550 | * 10/1998 | Kadota et al. | 349/43 |
| 5,899,741 | * 5/1999 | Tseng et al. | 438/649 |
| 5,908,309 | * 6/1999 | Andoh | 438/231 |
| 5,930,617 | * 7/1999 | Wu | 438/233 |

OTHER PUBLICATIONS

Materials and Bulk Processes, "Doping Technologies", The National Technology Roadmap for Semiconductors (1994), pp. 118–121.

"Ultra Shallow Junction Formation Using Diffusion from Silicides" H. Jiang, et al., J. Electrochem. Soc., vol. 139, No. 1, Jan. 1992, pp. 196–218.

* cited by examiner

*Primary Examiner*—Long Pham

(57) ABSTRACT

High integrity ultra-shallow source/drain junctions are formed employing cobalt silicide contacts. These are formed by depositing a layer of cobalt on a substrate above intended source/drain regions, and depositing a doped amorphous silicon film on the cobalt. Silicidation, as by rapid thermal annealing, is performed to form a low-resistance cobalt suicide while consuming the amorphous silicon film and diffusing impurities from the doped amorphous silicon film through the cobalt silicide into the substrate. The diffusion of the impurities forms shallow junctions extending into the substrate a substantially constant depth below the cobalt silicide/silicon substrate interface. The consumption of the amorphous silicon film during silicidation, which results in less consumption of substrate silicon, and formation of source/drain junctions self-aligned to the cobalt silicide/silicon substrate interface, enables the formation of ultra-shallow source/drain junctions without junction leakage while allowing the formation of cobalt silicide contacts at optimum thickness, thereby facilitating reliable device scaling.

22 Claims, 6 Drawing Sheets

FORMATION OF JUNCTIONS BY DIFFUSION FROM A DOPED AMORPHOUS SILICON FILM DURING SILICIDATION

RELATED APPLICATIONS

This application contains subject matter related to subject matter disclosed in copending U.S. patent application Ser. No. 09/187,521 filed Nov. 6, 1998, U.S. patent application Ser. No. 09/187,427 filed Nov. 6, 1998, and U.S. patent application Ser. No. 09/186,073 filed Nov. 5, 1998.

FIELD OF THE INVENTION

The present invention relates to a method of manufacturing a semiconductor device comprising refractory metal silicide contacts to source/drain and silicon gate regions. The present invention has particular applicability in manufacturing reliable high density semiconductor devices with submicron design features, shallow junction depths and cobalt silicide contacts to source/drain regions.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

In the manufacture of conventional complementary metal oxide semiconductor (CMOS) devices, referring to FIG. 1A, isolation regions 110, called field oxide regions, are formed in a semiconductor substrate 100 of silicon dioxide by local oxidation of silicon (LOCOS) or by shallow trench isolation (STI). A conductive gate 130, such as polysilicon, is also formed on substrate 100, with a gate oxide layer 120 in between. Dielectric spacers 140 are formed on sidewalls of the gate 130, and source/drain regions 150 are formed on either side of gate 130 by implantation of impurities.

As gate lengths are reduced below $0.5\mu$, refractory metal silicide layers, such as titanium silicide, are typically formed over source/drain regions 150 and gate 130 to reduce the sheet resistance of these components, thereby improving device performance. Referring to FIG. 1B, a titanium layer 160 is deposited, as by sputtering, over the entire substrate 100 as well as field oxide 110, gate 130 and spacers 140. A low temperature rapid thermal anneal (RTA) reaction creates a first-phase titanium silicide (C49) on the exposed silicon of gate 130 and source/drain regions 150. The unreacted titanium over field oxide 110 and spacers 140 is then removed, and a high temperature RTA reaction changes the first-phase titanium silicide into a low-resistance second-phase titanium silicide 170 (C54), as shown in FIG. 1C. Since the titanium silicide does not form on field oxide 110 or spacers 140, it is self-aligned to the gate 130 and source/drain regions 150. Hence, the titanium silicide formed in this process is known as "titanium salicide" (self-aligned silicide).

Titanium salicide is effective in decreasing sheet resistance if the gate length is greater than about $0.25\mu$. At a gate length of about $0.25\mu$ the titanium silicide sheet resistance rises dramatically due to narrow-line effects; that is, the low-resistivity silicide C54 does not completely form because first-phase C49 grains are very large (about $0.5\mu$), and hence there are fewer nucleation sites on the gate to nucleate the low-resistivity C54 during the high-temperature RTA.

To maintain low sheet resistance as gate lengths are decreased in scale below about $0.25\mu$, cobalt is typically used instead of titanium in silicide formation. Cobalt silicide does not display the undesirable narrow-line effects of titanium silicide because the conversion from its first-phase to its low-resistivity second-phase cobalt silicide is a diffusion reaction, rather than the nucleation and growth reaction as with titanium silicide and, therefore, the relationship of grain size to gate size is not a limiting factor.

However, the cobalt salicide process has a drawback in that cobalt silicide is more likely than titanium silicide to cause source and drain junction leakage, which can result in unacceptably high power dissipation as well as functional failure. This problem becomes especially critical as gate lengths are scaled below $0.25\mu$, and source and drain junctions are typically made shallower to prevent transistor short-channel effects. Since shallow junctions are more susceptible to junction leakage than deep junctions, cobalt silicide related junction leakage effectively limits CMOS device scaling.

A cause of this junction leakage, referring to FIG. 2, is the unevenness of the interface between the cobalt silicide 210 and the silicon source/drain regions 220, which results in an insufficient distance between portions of the bottom of the cobalt silicide 210 and source/drain junctions 220a. When a junction 220a is biased, a depletion region (i.e., an area depleted of free carriers) is formed which extends on either side of the junction 220a. Since the distance the depletion region spreads from the junction 220a is inversely proportional to the doping of the region, and source/drain region 220 is more heavily doped than substrate 200, the depletion region spreads mainly into substrate 200. Nevertheless, if cobalt silicide 210 extends into the depletion region, leakage can occur as carriers are swept across this highly charged region.

Junction leakage also occurs due to consumption of substrate silicon during silicide formation. For example, when cobalt silicide is formed to a given thickness, a thickness of substrate silicon proportional to the thickness of the silicide is consumed. As junctions become shallower with device scaling, consumption of substrate silicon during silicidation results in an insufficient distance between portions of the bottom of the cobalt silicide 210 and source/drain junctions 220a and, hence, junction leakage. Junction integrity can be maintained by providing a large enough distance between junction 220a and the interface of silicide 210 and source/drain region 220; i.e., by reducing the thickness of cobalt silicide 210. However, reducing its thickness increases the sheet resistance of cobalt silicide 210, thus reducing its effectiveness. Alternatively, junction leakage can be avoided by forming deeper source/drain regions. However, this is not desirable as it leads to reduced device performance.

Copending U.S. patent applications Ser. No. 09/187,521, and Ser. No. 09/187,427 disclose methodologies for forming junctions self-aligned to the bottom of the cobalt silicide, thus avoiding junction leakage. According to these methodologies, a doped film is deposited on top of the cobalt or cobalt silicide, from which impurities are diffused through the cobalt silicide to form source/drain regions having a junction depth which is substantially evenly spaced from the metal silicide/silicon interface. The methodologies of copending U.S. patent applications Ser. No. 09/187,521 and Ser. No. 09/187,427 address the problem of the unevenness of the silicide/silicon interface resulting in an insufficient distance between portions of the bottom of the silicide and the source/drain junctions, but do not directly address the problem of substrate silicon consumption during silicidation.

There exists a need for a method of manufacturing a semiconductor device with ultra-shallow source/drain junctions and a low-resistance refractory metal silicide layer over its source/drain regions which does not cause junction leakage.

SUMMARY OF THE INVENTION

An advantage of the present invention is a method of manufacturing a semiconductor device having a metal silicide layer over its source/drain regions which does not adversely affect junction integrity.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a metal layer on a semiconductor substrate; forming a doped amorphous silicon layer having impurities on the metal layer; heating to form a metal silicide layer from the metal layer and the amorphous silicon layer; and heating to diffuse the impurities into the substrate to form source/drain regions having a junction depth below the metal silicide layer.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention addresses and solves problems stemming from conventional methods of forming low resistance cobalt silicide contacts on source/drain regions, particularly source/drain regions having ultra-shallow junction depths such as about 2000 Å and under; e.g., 500 Å and under. Such conventional cobalt silicide methodology consumes a significant thickness of substrate silicon during silicide formation, and results in an uneven interface between the cobalt silicide contacts and the silicon of the source/drain regions and a less than optimal distance between the cobalt silicide and the shallow source/drain junctions, thus causing junction leakage and preventing cost-effective device scaling.

According to the methodology of the present invention, a layer of metal, e.g., cobalt, is deposited on a substrate before forming the source/drain implants, i.e., above intended source/drain regions and also above gates, and a doped amorphous silicon film is deposited on the metal layer. As used throughout the present disclosure and claims, the term "substrate" denotes a semiconductor substrate or an epitaxial layer formed on the semiconductor substrate. Silicidation is then performed, consuming the amorphous silicon film to form the metal silicide contacts, while diffusing the dopants to form source/drain regions having a junction depth substantially evenly spaced from the metal silicide/silicon interface. For example, silicidation can be carried out by RTA to initially form a low-resistivity cobalt silicide phase consuming the amorphous silicon film and diffusing impurities from the doped film through the cobalt silicide and into the substrate to form the source/drain regions having a shallow junction. The impurities, which gain mobility when the doped film is heated, readily diffuse out of the doped film during the RTA process, and diffuse through the cobalt silicide into the substrate, as cobalt silicide does not have as great an affinity for dopants as the substrate silicon. Due to the high diffusivity of the impurities in the cobalt silicide, the impurities form a shallow source/drain junction self-aligned to the cobalt silicide/silicon interface, thus avoiding junction leakage independently of the interface shape and the cobalt silicide thickness. Furthermore, since silicon from the doped amorphous silicon film is consumed during silicidation, less substrate silicon is so consumed, enabling the formation of shallower junctions.

In another embodiment of the invention, a cap layer, e.g., titanium, is deposited on the cobalt layer to prevent atmospheric contaminants from interfering with the silicidation reaction, and the doped amorphous silicon film is deposited on the cap layer.

Figure 1A:
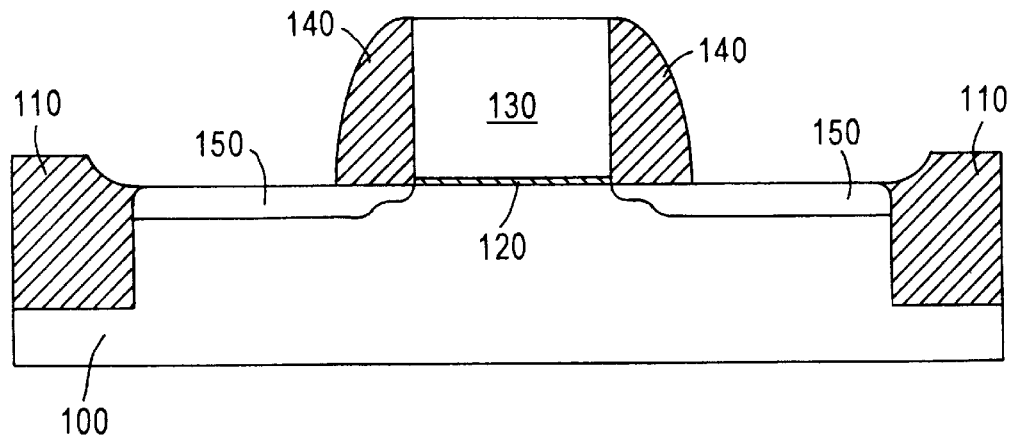
FIGS. 1A–1C schematically illustrate sequential phases of a conventional salicide technique.
Figure 1B:
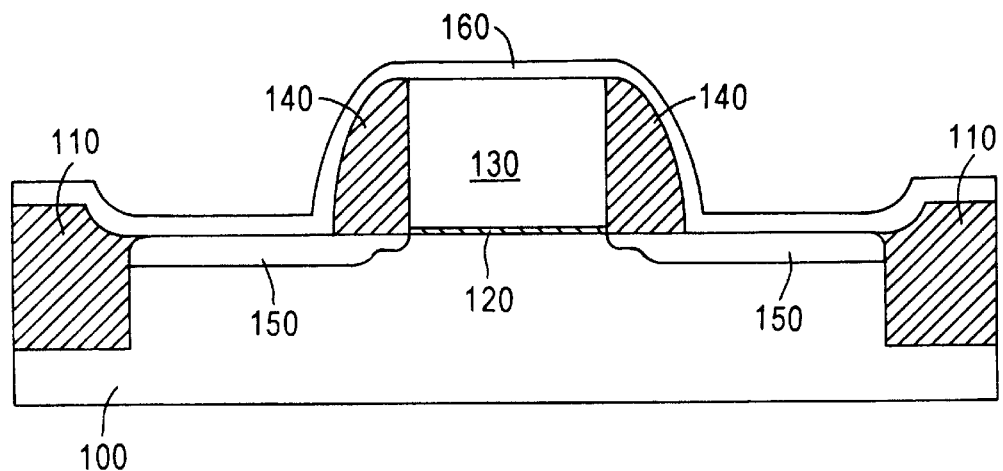
Figure 1C:
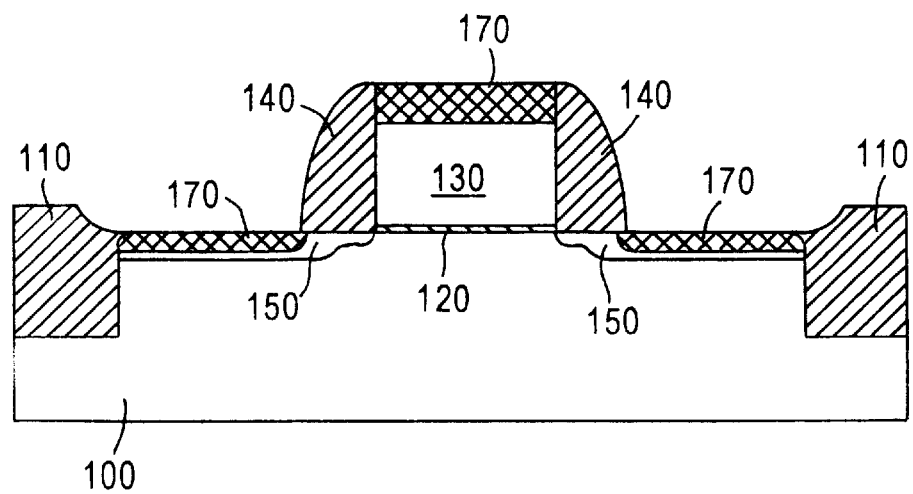
Figure 2:
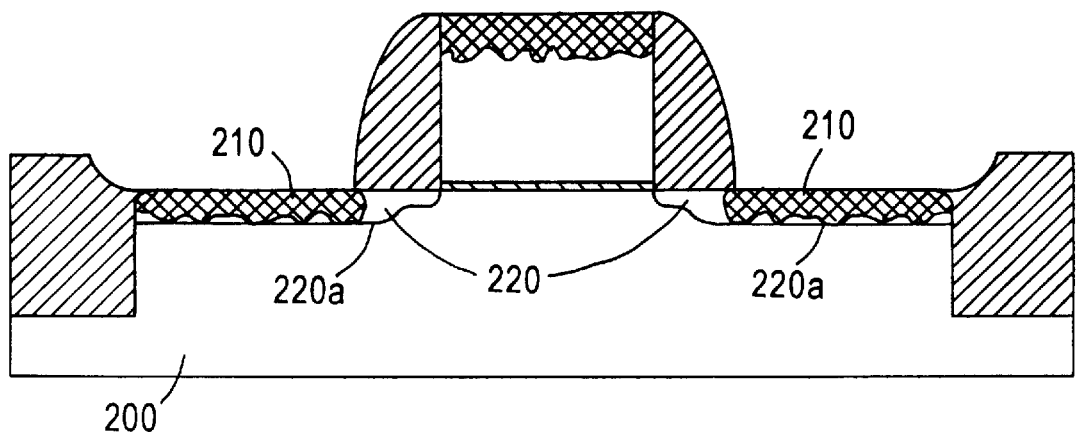
FIG. 2 depicts the results of a conventional method of cobalt salicide formation.
Figure 3A:
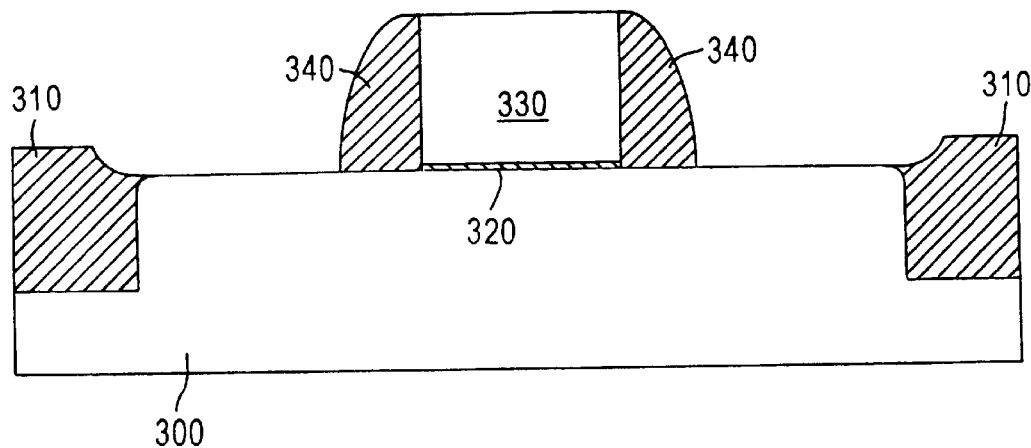
FIGS. 3A–3F schematically illustrate sequential phases of a method in accordance with an embodiment of the present invention.

An embodiment of the present invention is illustrated in FIGS. 3A–3F. As shown in FIG. 3A, field oxide regions 310 are formed on substrate 300, as by LOCOS or STI, followed by a thermally grown gate oxide layer 320 and a polysilicon gate 330, typically deposited by low pressure chemical vapor deposition (LPCVD), masked and etched. Dielectric spacers 340 are thereafter formed on sidewalls of gate 330, such as silicon dioxide deposited by LPCVD and anisotropically etched.

Figure 3B:
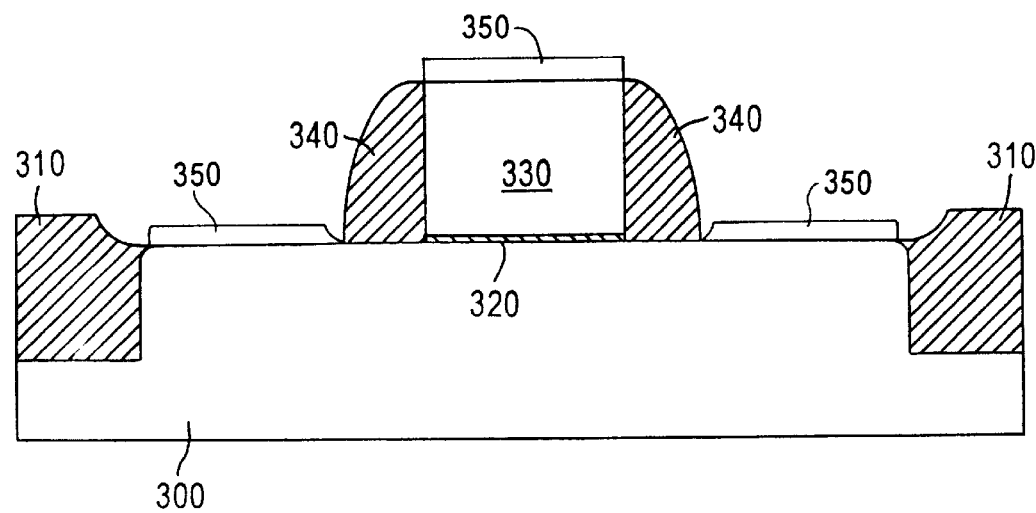
Figure 3C:
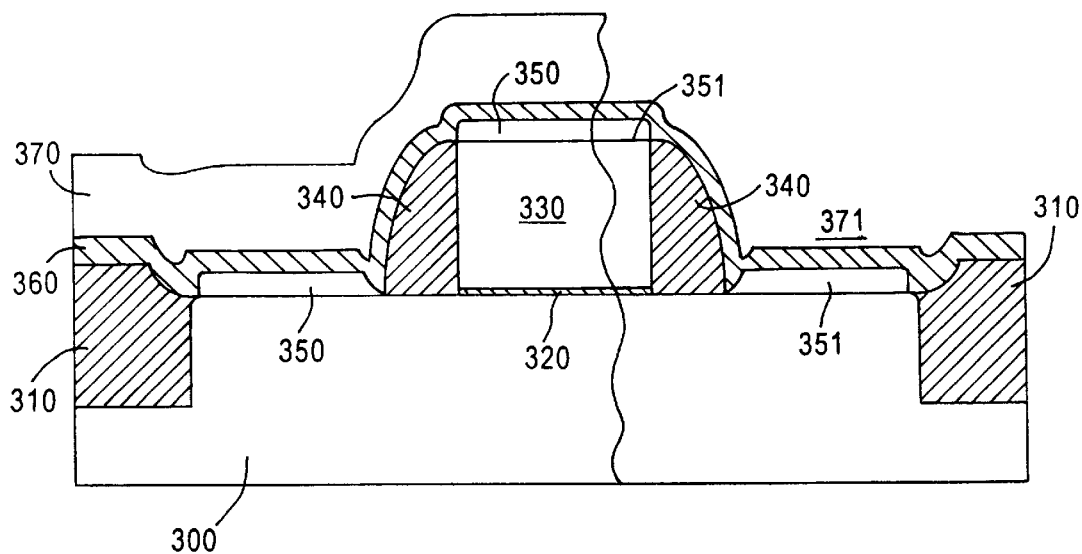

Referring to FIG. 3B, a cobalt layer 350 is deposited over the semiconductor device depicted in FIG. 3A, as by sputtering. A first doped amorphous silicon film 360 is deposited over cobalt layer 350, as by LPCVD (see FIG. 3C). First doped amorphous silicon film 360 is doped with a first conductivity type of impurity, either an n-type impurity such as phosphorus or arsenic, or a p-type impurity such as boron or indium, which will subsequently dope substrate 300 to form source/drain regions having ultra-shallow junctions.

Figure 3D:
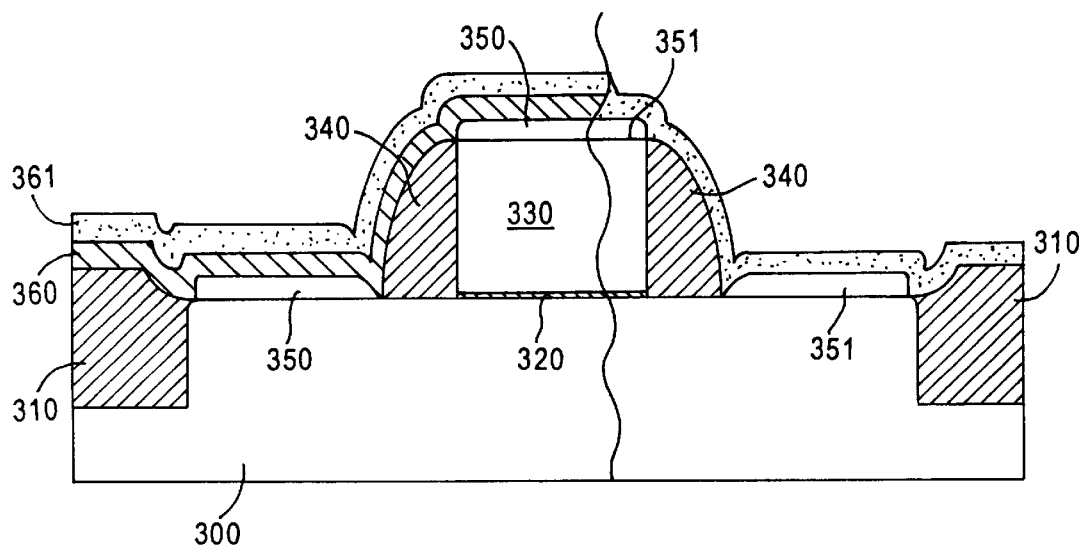

A photoresist mask 370 is formed on first doped amorphous silicon film 360, and has openings 371 corresponding to selected portions 351 of cobalt layer 350 which are not to receive dopant from first doped amorphous silicon film 360. First doped amorphous silicon film 360 is then etched to expose selected portions 351 of cobalt layer 350, and a second doped amorphous silicon film 361 is deposited over selected portions 351 and over first doped amorphous silicon film 360, as depicted in FIG. 3D. Second doped amorphous silicon film 361 is doped with a second conductivity type of impurity different than the first impurity type of first doped amorphous silicon film 360. Like the first doped amorphous silicon film 360, the second film 361 is deposited as by LPCVD, and contains impurities such as boron, arsenic, phosphorus, or indium depending on its impurity type.

Figure 3E:
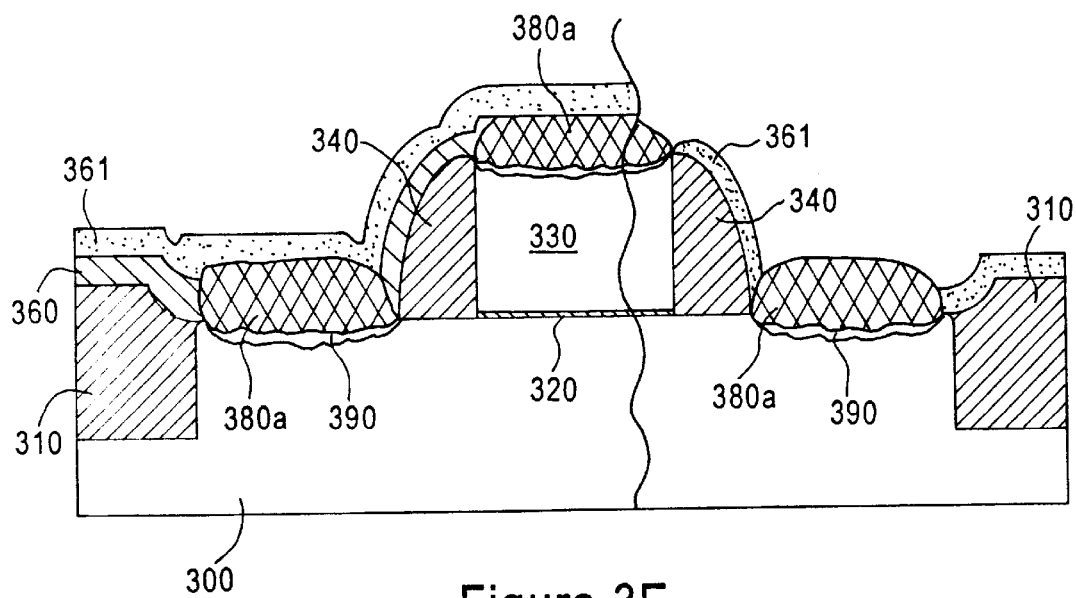

Next, referring to FIG. 3E, a low temperature RTA is performed at about 400° C. to about 600° C.; e.g., about 470° C., to cause cobalt layer 350 above the silicon of gate 330 and substrate 300 to react with silicon of substrate 300 and first and second doped amorphous silicon films 360, 361 and form a high-resistivity first-phase cobalt silicide 380a. Silicon from substrate 300 and from first and second doped amorphous silicon films 360, 361 are consumed at about equal rates during silicidation. Thus, the thickness of silicon of substrate 300 consumed during cobalt silicide 380a formation is reduced by the thickness of first and second doped amorphous silicon layers 360, 361, up to half the total thickness of silicon consumed. It is preferred to deposit first and second doped amorphous silicon films 360, 361 at a thickness such that they will be completely consumed during cobalt silicide formation; i.e., such that all the amorphous silicon on metal layer 350 will react with metal layer 350 to form CoSi, thereby minimizing the amount of substrate silicon consumed. For example, if the cobalt of metal layer 350 is formed at a thickness of about 100 Å to about 200 Å, first and second doped amorphous silicon films 360, 361 are deposited to about 50 Å to about 100 Å.

During cobalt silicide 380a formation, impurities diffuse out of first and second doped amorphous silicon films 360, 361, through cobalt silicide 380a and into gate 330 and source/drain regions 390 below cobalt silicide 380a. Because the impurities readily diffuse through the cobalt silicide 380a, source/drain regions 390 are formed self-aligned to the cobalt silicide/silicon interface and substantially equidistant therefrom, independent of the cobalt silicide/silicon interface shape. In other words, the bottom of source/drain regions 390 substantially correspond to the shape of the bottom of cobalt silicide 380a.

Figure 3F:
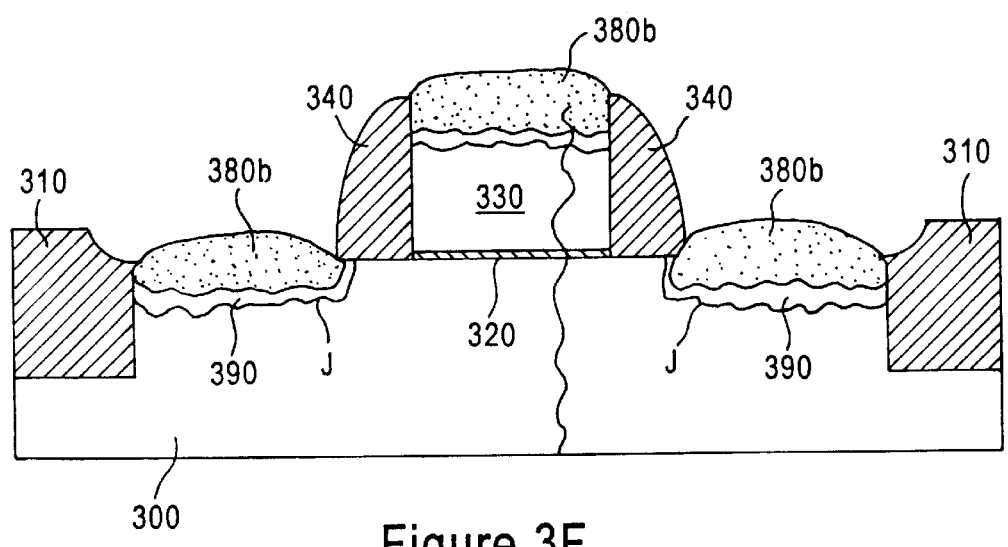

Thereafter, unreacted portions of first and second doped amorphous silicon films 360, 361, and cobalt layer 350, are stripped away, as by wet etching, and a high-temperature RTA is performed at about 700° C. to about 900° C.; e.g., about 825° C., to convert high-resistivity cobalt silicide 380a into a second-phase low-resistivity cobalt silicide 380b and to further diffuse the impurities in source/drain regions 390 into substrate 300 to form shallow junctions J at a depth of about 2000 Å or less; e.g., about 500 Å (see FIG. 3F). Junctions J are self-aligned to the low-resistivity cobalt silicide/silicon interface and substantially equidistant therefrom; i.e., the shape of junction J substantially corresponds to the shape of the bottom of cobalt silicide 380b, thus assuring a sufficient distance between the bottom of cobalt silicide 380b and junction J to avoid junction leakage, regardless of the interface shape and the cobalt silicide thickness.

The embodiment of FIG. 3F assumes that cobalt silicide is not formed on spacers 340 or on field oxide regions 310, as the silicided regions 380b cannot all contact one another. This can be accomplished in different manners, such as by masking and removing portions of cobalt layer 350 over spacers 340 before silicided regions 380a are formed. However, those of ordinary skill in the art will recognize that other ways of assuring that the regions over spacers 340 are free of silicide are possible.

Each of the first and second doped amorphous silicon films 360, 361 have an impurity concentration great enough to form junctions J; i.e., an impurity concentration of at least about 1% to about 10%, or about $6 \times 10^{21}$ $cm^{-2}$ to about $6 \times 10^{22}$ $cm^{-2}$.

Second doped amorphous silicon film 361 partially overlays first doped amorphous silicon film 360, as depicted in FIGS. 3D and 3E; however, the second conductivity type of impurity, initially carried by second doped amorphous silicon film 361, should not be allowed to diffuse through the first doped amorphous silicon film 360 (during the low temperature RTA) and counter-dope source/drain regions 390. The diffusion of the second conductivity type of impurity through first doped amorphous silicon film 360 is substantially prevented if the diffusion process is completed before an unacceptably large amount of the second type of impurity has sufficient time to diffuse through first doped amorphous silicon film 360. This can be achieved by providing a first conductivity type of impurity (carried by first doped amorphous silicon film 360) having a higher rate of diffusion than the second conductivity type of impurity; for example, providing first doped amorphous silicon film 360 having a p-type impurity, and second doped amorphous silicon film 361 having an n-type impurity. Additionally, unwanted diffusion of the second conductivity type of impurity through first doped amorphous silicon film 360 can be reduced by depositing first doped amorphous silicon film 360 in a layer having a greater thickness than the second doped amorphous silicon film 361.

Disadvantageous diffusion of the second conductivity type of impurity through first doped amorphous silicon film 360 can also be substantially prevented by providing the first conductivity type of impurity with a concentration in first doped amorphous silicon film 360 higher than a concentration of the second conductivity type of impurity in second doped amorphous silicon film 361. This is because a quantity of impurities sufficient to adversely counter-dope source/drain regions 390 cannot diffuse from second doped amorphous silicon film 361 through first doped amorphous silicon film 360 if first doped amorphous silicon film 360 contains substantially more dopant than second doped amorphous silicon film 361.

Figure 4A:
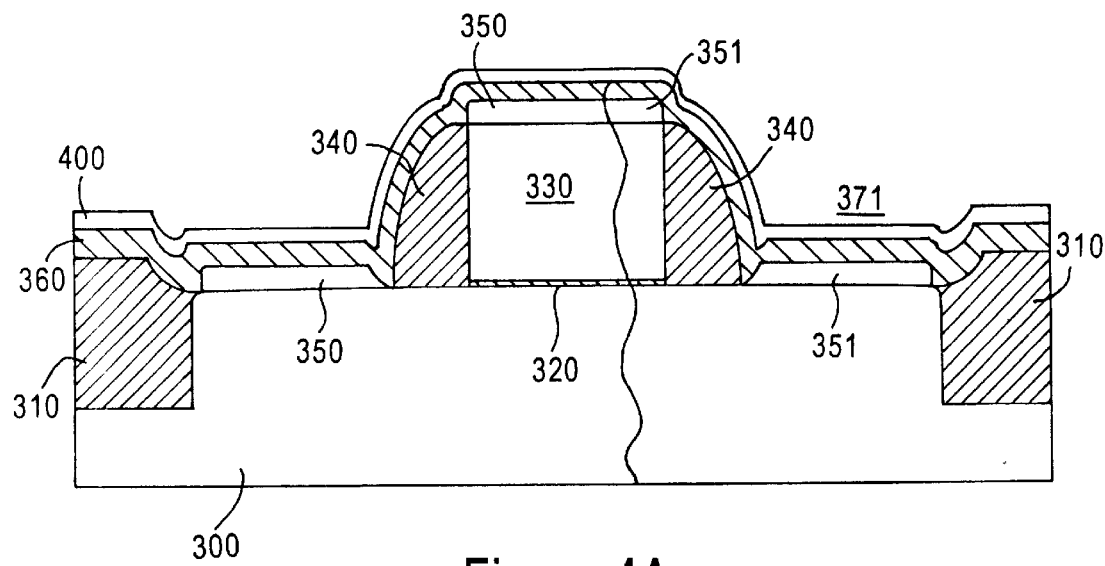
FIGS. 4A–4B schematically illustrate sequential phases of a method in accordance with another embodiment of the present invention.
Figure 4B:
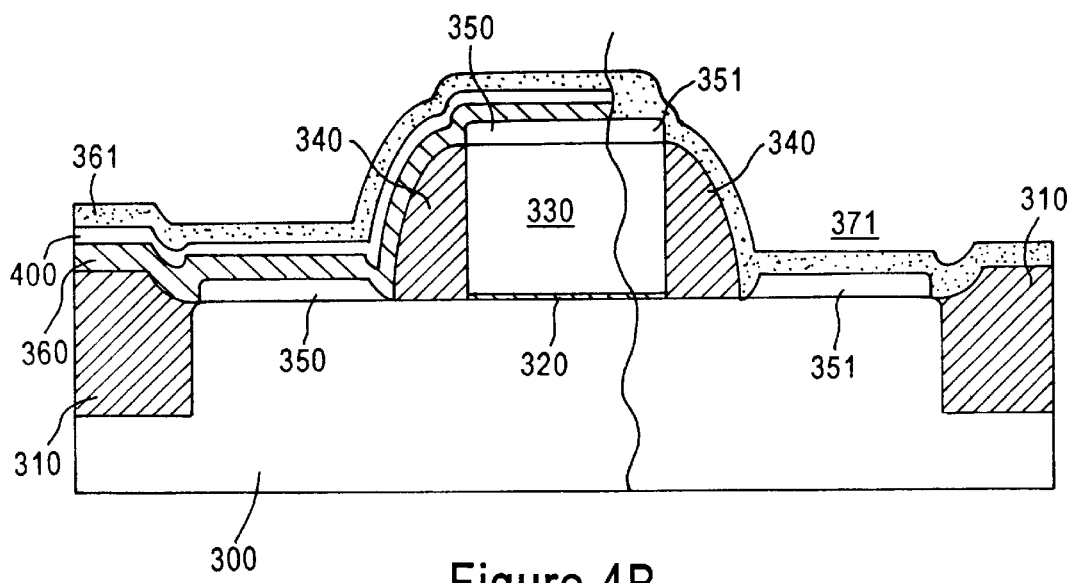

In another embodiment of the present invention, as shown in FIG. 4A, a skin of nitrogen 400 is grown on first doped amorphous silicon film 360, as by annealing first doped amorphous silicon film 360 in a nitrogen atmosphere after first doped amorphous silicon film 360 has been deposited, then masking and etching first doped amorphous silicon film 360 and skin 400 as described above with reference to FIG. 3C, and thereafter depositing second doped amorphous silicon film 361 (see FIG. 4B). Nitrogen effectively blocks the diffusion of impurities, such as boron. Thus, it is advantageous to form first doped amorphous silicon film 360 with an n-type impurity (e.g., silicon dioxide doped with arsenic), grow nitrogen skin 400 on first doped amorphous silicon film 360, then form second doped amorphous silicon film 361 with boron as the second conductivity type of impurity after masking and etching first doped amorphous silicon film 360. Nitrogen skin 400 between first and second doped amorphous silicon films 360, 361 substantially blocks diffusion of the boron out of second doped amorphous silicon film 361 into first doped amorphous silicon film 360.

In the previously described embodiment of the present invention illustrated in FIGS. 3A–3F, amorphous silicon film 360 is deposited directly on cobalt layer 350, and acts to prevent ambient oxygen and nitrogen from interfering with the cobalt-silicon reaction. In another embodiment of the invention, illustrated in FIGS. 5A–5D, a cap layer is formed on cobalt layer 350 before deposition of doped amorphous silicon film 360 to further shield the silicidation reaction from ambient oxygen and nitrogen. Referring to FIG. 5A, cap layer 355 of titanium or a derivative thereof (e.g., titanium nitride) is deposited on cobalt layer 350, as by sputtering to a thickness of about 50 Å. Cap layer 355 prevents contaminants such as ambient oxygen or nitrogen from interfering with the subsequent silicidation reaction between cobalt layer 350 and substrate 300, and between cobalt layer 350 and the subsequently formed amorphous silicon layers.

As illustrated in FIG. 5B, doped amorphous silicon film 360 is formed on cap layer 355, and is then masked and etched as described above with reference to FIG. 3C. Doped amorphous silicon layer 361 is then deposited as described above, and the low-temperature RTA previously described with reference to FIG. 3E is carried out, forming first-phase cobalt silicide 380a as a result of portions of cobalt layer 350 above the silicon of gate 330 and substrate 300 reacting with silicon of substrate 300 and first and second doped amorphous silicon films 360, 361. At the same time, a first-phase titanium silicide 385a is also formed as portions of cap layer 355 react with first and second doped amorphous films 360, 361 (see FIG. 5C).

Next, unreacted portions of cobalt layer 350, cap layer 355, and first and second doped amorphous films 360, 361 are stripped away as described above, and the high-temperature RTA previously described with reference to FIG. 3F is carried out to convert first-phase cobalt silicide 380a and titanium silicide 385a into second phase low-resistance cobalt silicide 380b and a second phase low-resistance titanium silicide 385b, as shown in FIG. 5D.

The methodology of the present invention enables formation of shallow source/drain regions having ultra-shallow junctions of high integrity with cobalt silicide contacts of optimized thickness thereon. By depositing cobalt prior to forming the source/drain implants, and then diffusing impurities through the cobalt silicide layer to form the source/drain regions during silicide formation, junctions are formed with a substantially constant spacing from the uneven cobalt silicide/silicon interface. Moreover, by providing an amorphous silicon layer above the cobalt layer, consumption of substrate silicon is reduced during silicide formation, enabling the formation of junctions of reduced depth vis-à-vis conventional methodology and the methodologies of copending applications Ser. Nos. 09/187,521 and 09/187,427 while avoiding junction leakage. Unlike conventional practices, the present invention enables cobalt silcide formation which is sufficiently spaced apart from ultra-shallow source/drain junctions to avoid junction leakage, regardless of the shape of the cobalt silicide/silicon interface or the thickness of the cobalt silicide layer. Thus, the present methodology facilitates device scaling by enabling the formation of low-resistance silicided source/drain regions having ultra-shallow junctions without silicide-related junction leakage. The present invention is applicable to the manufacture of various types of semiconductor devices having silicided source/drain regions, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a metal layer on a semiconductor substrate;

forming a doped amorphous silicon layer having impurities on the metal layer;

heating to form a metal silicide layer from the metal layer and the amorphous silicon layer; and heating to diffuse the impurities into the substrate to form source/drain regions having a junction depth below the metal silicide layer;

wherein the step of forming the doped amorphous silicon layer includes:

forming a first doped amorphous silicon film comprising a first conductivity type of impurity on the metal layer;

providing a mask on the first doped amorphous silicon film, the mask having openings over portions of the metal layer;

etching the first doped amorphous silicon film to expose the portions of the metal layer; and forming a second doped amorphous silicon film comprising a second conductivity type of impurity on the first doped amorphous silicon film and the exposed portions of the metal layer;

wherein the second conductivity type of impurity does not substantially diffuse through the first doped amorphous silicon film during heating to diffuse the impurities into the substrate.

2. The method according to claim 1, wherein the metal silicide layer has an irregular interface with the substrate, and the source/drain junctions are substantially equidistant from the irregular interface.

3. The method according to claim 1, wherein the step of heating to form a metal silicide layer includes:

heating at a first temperature to form a first-phase metal silicide layer from the metal layer and the amorphous silicon layer, and to diffuse the impurities into the substrate; and heating at a second temperature to form a second-phase metal silicide layer having a resistivity lower than that of the first-phase metal silicide layer, and to further diffuse the impurities into the substrate to form the source/drain regions.

4. The method according to claim 3, wherein the metal layer comprises cobalt, the first-phase metal silicide layer comprises cobalt silicide and the second-phase metal silicide layer comprises cobalt silicide.

5. The method according to claim 4, wherein the step of heating at the first temperature includes rapid thermal annealing at about 400° C. to about 600° C.; and the step of heating at the second temperature includes rapid thermal annealing at about 700° C. to about 900° C.

6. The method according to claim 4, wherein the step of heating at the first temperature includes rapid thermal annealing at about 470° C., and the step of heating at the second temperature includes rapid thermal annealing at about 825° C.

7. The method according to claim 4, wherein the source/drain junctions have a depth of about 2000 Å or less.

8. The method according to claim 4, wherein the source/drain junctions have a depth of about 500 Å or less.

9. The method according to claim 3, comprising heating at the first temperature for an amount of time sufficient to substantially consume the doped amorphous silicon layer when forming the first-phase metal silicide layer.

10. The method according to claim 9, comprising depositing the metal layer at a thickness of about 100 Å to about 200 Å and depositing the doped amorphous silicon layer at a thickness of about 50 Å to about 100 Å.

11. The method according to claim 1, comprising forming the doped amorphous silicon layer with an impurity concentration of about 1% to about 10%.

12. The method according to claim 1, comprising forming the doped amorphous silicon layer with an impurity concentration of about $6 \times 10^{21}$ cm$^{-2}$ to about $6 \times 10^{22}$ cm$^{-2}$.

13. The method according to claim 1, wherein the first conductivity type of impurity has a higher rate of diffusion than the second conductivity type of impurity.

14. The method according to claim 13, wherein the first conductivity type of impurity comprises a p-type impurity and the second conductivity type of impurity comprises an n-type impurity.

15. The method according to claim 1, further comprising forming a skin of nitrogen on the first doped amorphous silicon film to substantially prevent the second conductivity type of impurity from diffusing through the first doped amorphous silicon film while heating to diffuse the impurities into the substrate.

16. The method according to claim 15, wherein the first conductivity type of impurity comprises an n-type impurity and the second conductivity type of impurity comprises boron.

17. The method according to claim 16, wherein the step of forming the nitrogen skin includes annealing the first doped amorphous silicon film in a nitrogen atmosphere.

18. The method according to claim 1, wherein a concentration of the first conductivity type of impurity in the first doped amorphous silicon film is greater than a concentration of the second conductivity type of impurity in the second doped amorphous silicon film, and sufficient to substantially prevent the second conductivity type of impurity from diffusing through the first doped amorphous silicon film while heating to diffuse the impurities into the substrate.

19. The method according to claim 1, wherein the first doped amorphous silicon film has a thickness greater than a thickness of the second doped amorphous silicon film and sufficient to substantially prevent the second conductivity type of impurity from diffusing through the first doped amorphous silicon film while heating to diffuse the impurities into the substrate.

20. The method according to claim 1, wherein the step of forming the metal layer comprises:

forming a cobalt layer on the semiconductor substrate; and forming a metal cap layer on the cobalt layer.

21. The method according to claim 20, wherein the metal cap layer comprises titanium or titanium nitride.

22. The method according to claim 3, wherein the step of forming the metal layer comprises forming a cobalt layer on the semiconductor substrate and forming a titanium cap layer on the cobalt layer; and wherein the first-phase metal silicide layer comprises cobalt silicide and titanium silicide, and the second-phase metal silicide layer comprises cobalt silicide and titanium silicide.

* * * * *